(12) United States Patent
Chang et al.

(10) Patent No.: US 9,236,320 B2
(45) Date of Patent: Jan. 12, 2016

(54) CHIP PACKAGE

(71) Applicant: XINTEC INC., Zhongli, Taoyuan County (TW)

(72) Inventors: Yi-Ming Chang, Pingzhen (TW); Tsang-Yu Liu, Zhubei (TW); Yen-Shih Ho, Kaohsiung (TW); Ying-Nan Wen, Hsinchu (TW)

(73) Assignee: XINTEC INC., Taoyuan (TW)

( * ) Notice: Subject to any disclaimer, the term of this patent is extended or adjusted under 35 U.S.C. 154(b) by 0 days.

(21) Appl. No.: 14/315,163

(22) Filed: Jun. 25, 2014

(65) Prior Publication Data

US 2015/0001710 A1 Jan. 1, 2015

Related U.S. Application Data

(60) Provisional application No. 61/841,087, filed on Jun. 28, 2013.

(51) Int. Cl.
*H01L 23/31* (2006.01)
*H01L 23/00* (2006.01)

(52) U.S. Cl.
CPC ............ *H01L 23/3171* (2013.01); *H01L 24/05* (2013.01); *H01L 23/3114* (2013.01); *H01L 23/3192* (2013.01); *H01L 24/03* (2013.01); *H01L 24/48* (2013.01); *H01L 2224/0231* (2013.01); *H01L 2224/0235* (2013.01); *H01L 2224/02375* (2013.01); *H01L 2224/02379* (2013.01); *H01L 2224/0345* (2013.01); *H01L 2224/0346* (2013.01); *H01L 2224/0361* (2013.01); *H01L 2224/04042* (2013.01); *H01L 2224/05007* (2013.01); *H01L 2224/05026* (2013.01); *H01L 2224/0558* (2013.01); *H01L 2224/05082* (2013.01); *H01L 2224/05155* (2013.01); *H01L 2224/05164* (2013.01); *H01L 2224/05548* (2013.01); *H01L 2224/05562* (2013.01); *H01L 2224/05567* (2013.01); *H01L 2224/05571* (2013.01); *H01L 2224/05624* (2013.01); *H01L 2224/05644* (2013.01); *H01L 2224/05647* (2013.01); *H01L 2224/05655* (2013.01); *H01L 2224/06155* (2013.01); *H01L 2224/48145* (2013.01)

(58) Field of Classification Search
CPC ........................................................ H01L 21/14
USPC .......................................................... 257/737
See application file for complete search history.

(56) References Cited

U.S. PATENT DOCUMENTS

| | | | | |
|---|---|---|---|---|
| 5,946,552 A | * | 8/1999 | Bird et al. ...................... | 438/107 |
| 2010/0187676 A1 | * | 7/2010 | Suh et al. ...................... | 257/692 |
| 2011/0104888 A1 | * | 5/2011 | Kim et al. ...................... | 438/637 |
| 2011/0108981 A1 | * | 5/2011 | Rahim et al. .................. | 257/737 |
| 2013/0113094 A1 | * | 5/2013 | Wu et al. ....................... | 257/737 |

\* cited by examiner

*Primary Examiner* — Edward Wojciechowicz
(74) *Attorney, Agent, or Firm* — Liu & Liu

(57) ABSTRACT

A chip package is provided. The chip package includes a semiconductor chip, an isolation layer, a redistributing metal layer, and at least a bonding pad. The semiconductor chip includes at least one conducting disposed on a surface of the semiconductor chip. The isolation layer is disposed on the surface of the semiconductor chip, wherein the isolation layer has at least one first opening to expose the first conducting pad. The redistributing metal layer is disposed on the isolation layer and has at least a redistributing metal line corresponding to the conducting pad, the redistributing metal line is connected to the first conducting pad through the first opening. The bonding pad is disposed on the isolation layer and one side of the semiconductor chip, wherein the redistributing metal line extends to the bonding pad to electrically connect the conducting pad to the bonding pad.

28 Claims, 4 Drawing Sheets

CHIP PACKAGE

RELATED APPLICATIONS

This application claims priority to U.S. provisional Application Ser. No. 61/841,087, filed Jun. 28, 2013, which is herein incorporated by reference.

BACKGROUND

1. Field of Invention

The present invention relates to a package and a method for manufacturing thereof. More particularly, the present invention relates to a chip package with a special structure of bonding pads and only one side for bonding process.

2. Description of Related Art

In response to various demands on modern electrical products such as having multi-functions and high performance, integration density of a chip package utilized in those electrical products is increased. However, retaining a high reliability of the chip package utilized in those electrical products accordingly becomes more challenging. In the chip package, both ends of redistributing metal lines respectively connect to input/output conducting pads and bonding pads to redistribute conducting paths within the chip package. Bonding wires are bonded to the bonding pads, and the chip package could be integrated with a printed circuit board (PCB). Current signals are inputted/outputted from the PCB, and transmitted through the bonding wires, the bonding pads, the redistributing metal lines, and the input/output conducting pads to control the chip package.

In various prior arts relating chip packages, the bonding pads are distributed at sides of the chip package to perform wire-bonding processes easily. Furthermore, the bonding pads are respectively distributed at different sides of the in coped with the input/output conducting pads, which are predetermined at various locations on the chip package. It is well known that connections between the bonding pads and the bonding wires are important. The chip package would be failed if only one of these connections is failed. Therefore, increasing a reliability of these connections between the bonding pads and bonding wires of the chip package have become one of important issues in electronics industry.

SUMMARY

The present disclosure provides a chip package. The chip package has a special design, and the bonding pads of the chip package only disposed at single side of the chip package. Therefore, bonding process for forming connections between the bonding pads and the bonding wires is simplified and efficient. In addition, the chip package also has special structure of the bonding pads to reduce risks of oxidation or deterioration to connections between the bonding pads and the bonding wires. Therefore, lifetime of the chip package is extended and reliability of the chip package is further improved.

The present disclosure relates to a chip package. The chip package includes a semiconductor chip, an isolation layer, a redistributing metal layer, and at least one bonding pad. The semiconductor chip includes an upper surface and a lower surface. The semiconductor chip has at least one conducting pad, an interconnect structure, and a device, wherein the conducting pad is disposed on a surface of the semiconductor chip, the interconnect structure and the device are disposed in the semiconductor chip, and the device is electrically connected to the conducting pad through the interconnect structure. The an isolation layer is disposed on the surface of the semiconductor chip, and has at least one first opening to expose a part of the conducting pad. The redistributing metal layer is disposed on the isolation layer, and has a redistributing metal line corresponding to the conducting pad, wherein the redistributing metal line is connected to the conducting pad through the first opening. The bonding pad is disposed on the isolation layer and positioned at one side of the semiconductor chip. The redistributing metal line extends to the bonding pad to electrically connect the conducting pad disposed on the surface of the semiconductor chip and the bonding pad positioned at the side of the semiconductor chip.

In various embodiments of the present disclosure, the chip package further includes a first passivation layer covering the isolation layer, the redistributing metal layer and the bonding pad, wherein the first passivation layer has at least one second opening to expose a part of the bonding pad.

In various embodiments of the present disclosure, wherein the first passivation layer includes silicon oxide.

In various embodiments of the present disclosure, wherein the redistributing metal line comprises at least two straight parts and at least one turning part, wherein the two straight parts respectively extend along different directions, and the turning part connects the two straight parts, and a line width of the two straight parts is less than a line width of the turning part.

In various embodiments of the present disclosure, wherein the line width of the two straight parts is substantially 30-35 μm, and the line width of the turning part is substantially 80-85 μm.

In various embodiments of the present disclosure, the chip package further includes a second passivation layer disposed on the first passivation layer, wherein the second passivation layer also has the second opening to expose the part of the bonding pad.

In various embodiments of the present disclosure, wherein the first passivation layer includes silicon oxide, and the second passivation layer includes silicon nitride.

In various embodiments of the present disclosure, wherein the redistributing metal line includes at least two straight parts and at least one turning part, wherein the two straight parts extend along different directions, and the turning part connects the two straight parts, and a line width of the two straight parts is less than a line width of the turning part.

In various embodiments of the present disclosure, wherein the line width of the two straight parts is substantially 30-35 μm, and the line width of the turning part is substantially 80-85 μm.

In various embodiments of the present disclosure, the chip package further includes a first under bump metallurgy disposed in the second opening.

In various embodiments of the present disclosure, wherein the first under bump metallurgy includes a nickel layer, a palladium metal layer, and a gold metal layer. The nickel layer is disposed on the bonding pad. The palladium metal layer is disposed on the nickel layer. The gold metal layer is disposed on the palladium metal layer.

In various embodiments of the present disclosure, wherein the redistributing metal line includes at least two straight parts and at least one turning part, wherein the two straight parts extend along different directions, and the turning part connects the two straight parts, and a line width of the two straight parts is less than a line width of the turning part.

In various embodiments of the present disclosure, wherein the line width of the two straight parts is substantially 30-35 μm, and the line width of the turning part is substantially 80-85 μm.

In various embodiments of the present disclosure, the chip package further includes a second under bump metallurgy fully covering the bonding pad.

In various embodiments of the present disclosure, wherein the second under bump metallurgy includes a nickel layer, a palladium metal layer, and a gold metal layer. The nickel layer is disposed on the bonding pad. The palladium metal layer is disposed on the nickel layer. The gold metal layer is disposed on the palladium metal layer.

In various embodiments of the present disclosure, wherein the redistributing metal line includes at least two straight parts and at least one turning part, wherein the two straight parts extend along different directions, and the turning part connects the two straight parts, and a line width of the two straight parts is less than a line width of the turning part.

In various embodiments of the present disclosure, wherein the line width of the two straight parts is substantially 30-35 µm, and the line width of the turning part is substantially 80-85 µm.

In various embodiments of the present disclosure, wherein the second under bump metallurgy fully covers the redistributing metal line.

In various embodiments of the present disclosure, wherein the redistributing metal line includes at least two straight parts and at least one turning part, wherein the two straight parts extend along different directions, and the turning part connects the two straight parts, and a line width of the two straight parts is less than a line width of the turning part.

In various embodiments of the present disclosure, wherein the line width of the two straight parts is substantially 30-35 µm, and the line width of the turning part is substantially 80-85 µm.

In various embodiments of the present disclosure, the chip package further includes a third passivation layer covering the isolation layer and the second under bump metallurgy, wherein the third passivation layer has at least one third opening to expose a part of the second under bump metallurgy.

In various embodiments of the present disclosure, wherein the redistributing metal line includes at least two straight parts and at least one turning part, wherein the two straight parts extend along different directions, and the turning part connects the two straight parts, and a line width of the two straight parts is less than a line width of the turning part.

In various embodiments of the present disclosure, wherein the line width of the two straight parts is substantially 30-35 µm, and the line width of the turning part is substantially 80-85 µm.

In various embodiments of the present disclosure, the chip package further includes a fourth passivation layer disposed on the third passivation layer, wherein the fourth passivation layer also has the third opening to expose the part of the second under bump metallurgy.

In various embodiments of the present disclosure, wherein the redistributing metal line includes at least two straight parts and at least one turning part, wherein the two straight parts extend along different directions, and the turning part connects the two straight parts, and a line width of the two straight parts is less than a line width of the turning part.

In various embodiments of the present disclosure, wherein the line width of the two straight parts is substantially 30-35 µm, and the line width of the turning part is substantially 80-85 µm.

It is to be understood that both the foregoing general description and the following detailed description are by examples, and are intended to provide further explanation of the invention as claimed.

BRIEF DESCRIPTION OF THE DRAWINGS

The invention can be more fully understood by reading the following detailed description of the embodiment, with reference made to the accompanying drawings as follows.

DETAILED DESCRIPTION

Figure 1:
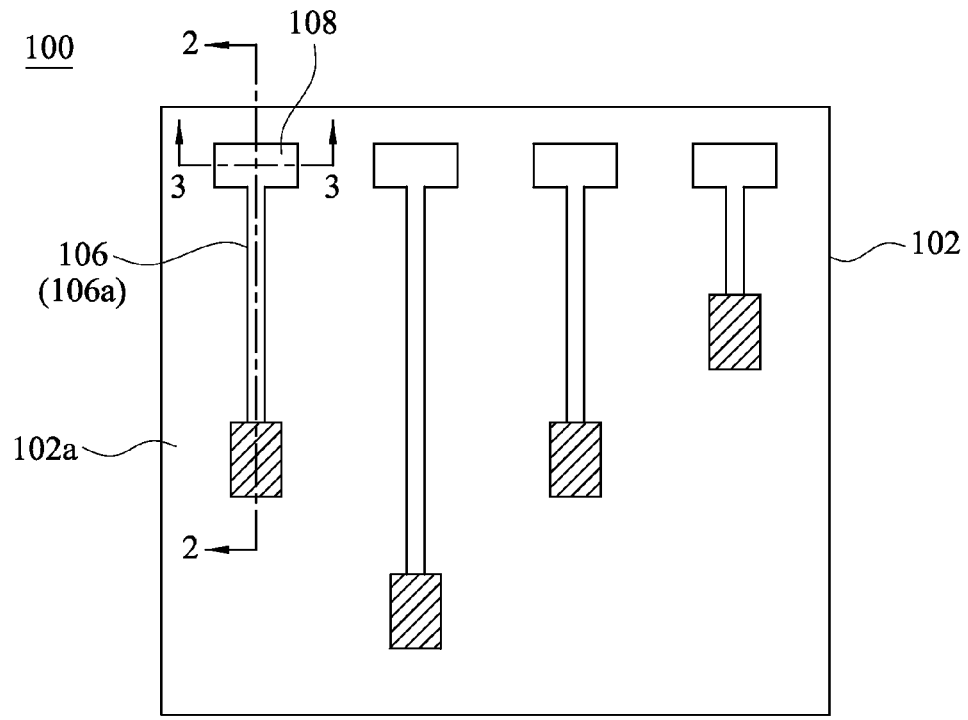
FIG. 1 is a schematic top-view of the chip package according to various embodiments of the present disclosure.

Reference will now be made in detail to the present embodiments of the invention, examples of which are illustrated in the accompanying drawings. Wherever possible, the same reference numbers are used in the drawings and the description to refer to the same or like parts.

Figure 2:
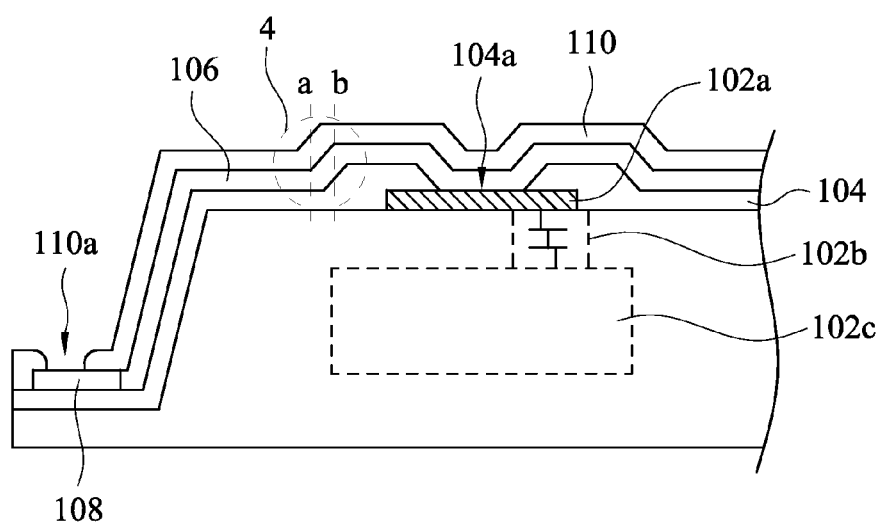
FIG. 2 is a cross-sectional view along line 2 in FIG. 1.

Please refer to FIG. 1 and FIG. 2. FIG. 1 is a schematic top-view of the chip package according to various embodiments of the present disclosure. FIG. 2 is a cross-sectional view along line 2 in FIG. 1.

As shown in FIG. 1 and FIG. 2. The chip package 100 according to various embodiments of the present disclosure includes a semiconductor chip 102, an isolation layer 104, a redistributing metal layer 106, and a bonding pad 108. As illustrated in FIG. 2, the semiconductor chip 102 has at least one conducting pad 102a, an interconnect structure 102b, and a device 102c. The conducting pad 102a is disposed on a surface of the semiconductor chip 102. The interconnect structure 102b and the device 102c are disposed in the semiconductor chip 102. The device 102c is electrically connected to the conducting pad 102a through the interconnect structure 102b. The semiconductor chip 102, for example, could be a silicon base semiconductor chip, a germanium base semiconductor chip, or other group III-V base semiconductor chip. However, the present disclosure is not limited thereto. The conducting pad 102a is an input/output (I/O) conducting pad of the semiconductor chip 102. The shape, quantity, and distribution of the conducting pads 102a could be illustrated as shown in FIG. 2. However, the present disclosure is not limited thereto, and the shape, quantity, and distribution of the conducting pads 102a could be designed according to various requirements. The conducting pad 102a could include, but not limited to, a single layer or multi-layers of copper, aluminum, tungsten, or conductive polymers. The interconnect structure 102b, for example, could include copper, aluminum, tungsten as an electrically conductive path. The device 102c could be active elements, passive elements, electronic components, opto electronic devices, micro electro mechanical systems (MEMS), micro fluidic systems, physical sensors, RF circuits, accelerators, gyroscopes, micro actuators, surface acoustic wave components, pressure sensors, or ink printer heads. However, the present disclosure is not limited thereto. The interconnect structure 102b and the device 102c are formed in the semiconductor chip 102. Both ends of the interconnect structure 102*b* are respectively electrically connected to the device 102*c* and the conducting pad 102*a* such that the conducting pad 102*a* on the surface of the semiconductor chip 102 could be an input/output (I/O) conducting pad to control the device 102*c* in the semiconductor chip 102.

Referring to FIG. 2, the isolation layer 104 is disposed on the surface of the semiconductor chip 102. The isolation layer 104 has at least one first opening 104*a* to expose a part of the conducting pad 102*a*. The isolation layer 104, for example, could be silicon oxide, silicon nitride, silicon oxynitride, or other suitable isolation materials. The isolation layer 104 could be formed by depositing (in chemical vapor deposition (CVD), or spin coating) an isolation film including silicon oxide, silicon nitride, silicon oxynitride, or other suitable isolation materials on the surface of the semiconductor chip 102. The isolation film covers the conducting pad 102 on the surface of the semiconductor chip 102. The isolation film is litho-etched to form the first opening 104*a* of the isolation layer 104 corresponding to the conducting pad 102*a* on the surface of the semiconductor chip 102. The first opening 104*a* exposes a part of the conducting pad 102*a*, and the part of the conducting pad 102*a* is electrically connected to the redistributing metal layer 106 formed in following operations.

Referring to FIG. 2, the redistributing metal layer 106 is disposed on the isolation layer 104 and has a redistributing metal line 106*a* corresponding to the conducting pad. The redistributing metal line 106*a* is connected to the conducting pad 102*a* through the first opening 104. The redistributing metal layer 106 could include aluminum, copper, nickel, or other suitable metal materials. The redistributing metal layer 106 could be formed by sputtering, evaporation, or other suitable processes to overall deposit aforementioned metal material on the isolation layer 104. The metal material is further patterned by litho-etching processes such that redistributing metal line 106*a* is formed on the isolation layer 104. As illustrated in FIG. 1, the conducting pads 102*a* are respectively corresponding to the redistributing metal lines 106*a*.

Referring to FIG. 1 and FIG. 2, the bonding pad 108 is disposed on the isolation layer 104 and positioned at one side of the semiconductor chip 102. The bonding pad 108 provides a site of the chip package 100 for a bonding wire to bond thereon. The bonding pad 108, for example, could include aluminum, copper, nickel, or other suitable metal materials. The bonding pads 108 and the redistributing metal layer 106 could be formed simultaneously or respectively. The bonding pads 108 could be formed by sputtering, evaporation, or other suitable processes to deposit aforementioned metal material on the isolation layer 104. The metal material is further patterned by litho-etching processes such that the bonding pad 108 formed is positioned at one side of the semiconductor chip 102. In should be noticed that the redistributing metal line 106*a* extends to the bonding pad 108 to electrically connect the conducting pad 102*a* disposed on the surface of the semiconductor chip 102. The bonding wire could be bonded on the bonding pad 108 positioned at the side of the semiconductor chip 102 could be further electrically connected to a printed circuit board (PCB). Therefore, the conducting pad 102 disposed on the surface of the semiconductor chip 102 of chip package 100 according various embodiments of the present disclosure could be electrically connected to the printed circuit board through the bonding pad 108 and the redistributing metal line 106*a*. Accordingly, the semiconductor chip 102 could input or output current signals with the PCB through the conducting pad 102*a*. Furthermore, the bonding wire could be also connected to other semiconductor chips or other interposers such that the semiconductor chip 102 is integrated to other semiconductor chips or other interposers to form a 3D-IC stacking structure. One character of the chip package 100 according to various embodiments of the present disclosure is that the redistributing metal layer 106 has a special pattern of the redistributing metal line 106*a*, which is formed by litho-etching processes. The redistributing metal lines 106*a* gather all electrically conductive path of the conducting pads 102*a*, which is distributed on different positions of the surface of the semiconductor chip 102, to the bonding pads 108 positioned at one side of the semiconductor chip 102. Therefore, bonding sites of the chip package 100 according to various embodiments of the present disclosure are concentrated in only one side such that bonding processes could be performed focus on only one side of the semiconductor chip 102. Accordingly, the fabrication of the chip package 100 according to various embodiments of the present disclosure is simplified and therefore has an improved through put.

Figure 3:
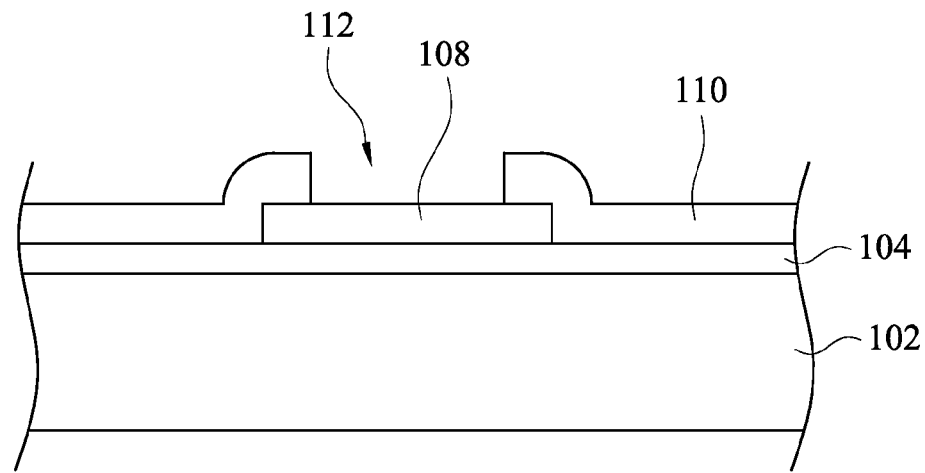
FIG. 3 is a cross-sectional view along line 3 in FIG. 1.

FIG. 3 is a cross-sectional view along line 3 in FIG. 1. Referring to FIG. 3 coped with FIG. 1 and FIG. 2, in various embodiments of the present disclosure, the chip package 100 further includes a first passivation layer 110 covering the isolation layer 104, the redistributing metal layer 106, and the bonding pad 108. The first passivation layer 110 has at least one second opening 110*a* to expose a part of the bonding pad 108. The first passivation layer 110 could include silicon oxide, silicon nitride, silicon oxynitride, or other suitable isolation materials. The first passivation layer 110 could be formed by depositing (in chemical vapor deposition (CVD), or spin coating) an passivation film including silicon oxide, silicon nitride, silicon oxynitride, or other suitable isolation materials on the isolation layer 104 on the surface of the semiconductor chip 102. The passivation film covers the isolation layer 104, the redistributing metal layer 106 and the bonding pad 108. The passivation film is litho-etched to form the second opening 112 to expose a part of the bonding pad 108, and the part of the bonding pad 108 is the site for the bonding wire to bond thereon. It should be noticed that the first passivation layer 110 according to various embodiments of the present disclosure covers the redistributing metal layer 106 on the surface of the semiconductor chip 102. Therefore, moisture or other pollutants are isolated from the redistributing metal layer 106 so that the issue of oxidation or deterioration of the redistributing metal line 106*a* could be avoided. Furthermore, the first passivation layer 110 also covers the part of the bonding pad 108, and merely leaves the second opening 112 for the bonding wire. Therefore, the risk of oxidation or deterioration of the bonding pad 108 could be reduced. In addition, the first passivation layer 110 also improves the stability of the bonding pad 108 during the wire-bonding processes. It is well known that the weakest sites of a chip package are the bonding pads, and the chip package could be failed as long as one of the bonding pads is failed on wire-bonding processes. The chip package 100 according to various embodiments of the present disclosure has hardly oxidized and more stable bonding pads 108 to provide better sites for bonding wires to bond thereon. Therefore, the chip package 100 according to various embodiments of the present disclosure could have longer lifetime and better reliability.

Figure 4:
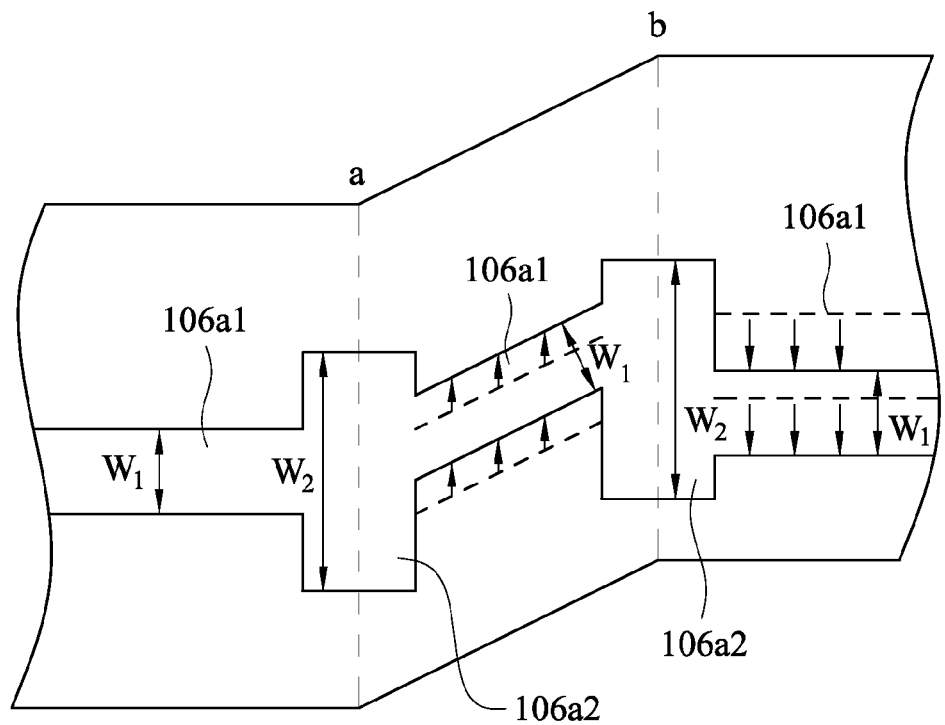
FIG. 4 is a lateral view of a portion 4 in FIG. 2.

FIG. 4 is a lateral view of a portion 4 in FIG. 2. Referring to FIG. 4 and FIG. 2, in various embodiments of the present disclosure, the redistributing metal line 106*a* includes at least two straight parts 106*a*1 and at least one turning part 106*a*2. The two straight parts 106*a*1 respectively extend along different directions, and the turning part 106*a*2 connects the two straight parts 106*a*1. A line width W1 of the two straight parts 106a1 is less than a line width W2 of the turning part 106a2. As illustrated in FIG. 2, a path of the redistributing metal line 106a extending from the conducting pad 102a to the bonding pad 108 would pass through several surfaces with different altitudes (as the portion 4 in FIG. 2). The topography with different altitudes, for example, could be formed because the conducting pad 102a elevates the isolation layer 104 formed afterwards. When the redistributing metal line 106a are formed on the topography with different altitudes, mismatches are frequently happened at the turning sites (such as the a-b surface in the portion 4 illustrated in FIG. 2). During the operations of depositing the redistributing metal layer 106 on the isolation layer 104 and litho-etching the redistributing metal layer 106 to yield the redistributing metal line 106a, it is both highly challenging for the deposition and litho-etching processes to maintain identical performance between surfaces in different directions. In other words, process variations are easily happened between the surfaces in different directions such that different parts of the redistributing metal line 106a, which are respectively disposed on different surfaces, are mismatched and failed to connect each other to form the consistent redistributing metal line 106a. Therefore, the redistributing metal line 106a as a conductive path is failed. As illustrated in FIG. 4, in various embodiments of the present disclosure, the redistributing metal line 106a includes three adjacent straight part 106a1, which are respectively disposed on different surfaces, and two turning parts 106a2 to connect the three adjacent straight part 106a1. It should be noticed that the line width W1 of the straight parts is less than the line width W2 of the turning part 106a2. In various embodiments of the present disclosure, the line width W1 of the straight part 106a1 is substantially 30-35 μm, and the line width W1 of the turning part is substantially 80-85 μm. Therefore, even when the straight parts 106a1 are shifted as indicated in arrow in FIG. 4, the turning part 106a2 with greater line width W2 still connect the shifted straight parts 106a1. Specifically, the special shapes of the redistributing metal line 106a according to various embodiments of the present disclosure provides larger process margin of the deposition and litho-etching processes for patterning the redistributing metal layer 106. The redistributing metal line 106a of the redistributing metal layer 106 could be consistent even when process variations happen. The special shapes of the redistributing metal line 106a according to various embodiments of the present disclosure could be formed by applying a mask with a special layout. The special layout in the mask is designed to have larger line width corresponding to the turning sites (such as the a-b surface in the portion 4 illustrated in FIG. 2). In addition, the shape of the turning part 106a2 could be well adjusted according to various requirements. Therefore, the shape of the turning part 106a2 is not limited to that illustrated in FIG. 4.

Furthermore, various designs could also apply to the bonding pads 108 in order to further enhance lifetime and reliability of the chip package 100.

Figure 5:
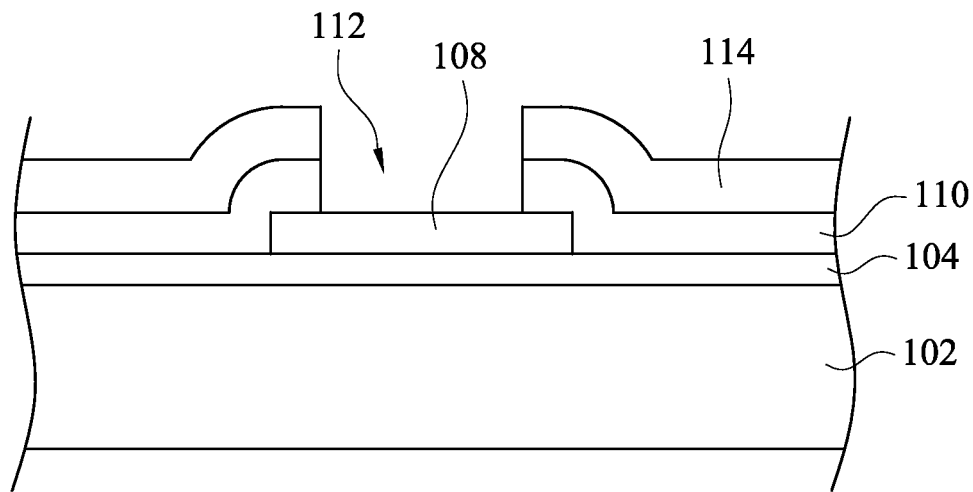
FIG. 5 is a cross-sectional view corresponding to line 3 in FIG. 1 according to other various embodiments of the present disclosure.

FIG. 5 is a cross-sectional view corresponding to line 3 in FIG. 1 according to other various embodiments of the present disclosure. Referring to FIG. 5 and FIG. 1, the chip package 100 according to other various embodiments of the present disclosure further includes a second passivation layer 114 disposed on the first passivation layer 110. The second passivation layer 114 also has the second opening 112 to expose the part of the bonding pad 108. The first passivation layer 110 could be formed by depositing (in chemical vapor deposition (CVD), or spin coating) a first passivation film including silicon oxide, silicon nitride, silicon oxynitride, or other suitable isolation materials on the isolation layer 104 on the surface of the semiconductor chip 102. The first passivation film covers the isolation layer 104, the redistributing metal layer 106 and the bonding pad 108. The second passivation layer 114 could be also formed by depositing (in chemical vapor deposition (CVD), or spin coating) a second passivation film including silicon oxide, silicon nitride, silicon oxynitride, or other suitable isolation materials on the first passivation layer 110. Both of the first passivation film and the second passivation film are litho-etched to form the second opening 112 to expose the part of the bonding pad 108, and the part of the bonding pad 108 is the site for the bonding wire to bond thereon. In various embodiments of the present disclosure, the first passivation layer 110 includes silicon oxide, and the second passivation layer 114 comprises silicon nitride. It should be noticed that the second passivation layer 114 and the first passivation layer 110 according to other various embodiments of the present disclosure also covers the part of the bonding pad 108, and merely leaves the second opening 112 for the bonding wire. Therefore, the risk of oxidation or deterioration of the bonding pad 108 could be further reduced. In addition, the second passivation layer 114 and the first passivation layer 110 also further improve the stability of the bonding pad 108 during the wire-bonding processes. The chip package 100 according to other various embodiments of the present disclosure has more hardly oxidized and more stable bonding pads 108 to provide better sites for bonding wires to bond thereon. Therefore, the chip package 100 according to other various embodiments of the present disclosure could have much longer lifetime and better reliability. Besides, the shape of the redistributing metal line 106a could be similar to that aforementioned (as illustrated in FIG. 4). In other words, the redistributing metal line 106a includes at least two straight parts 106a1 and at least one turning part 106a2, wherein the two straight parts 106a1 extend along different directions, and the turning part 106a2 connects the two straight parts 106a1, and the line width W1 of the two straight parts 106a1 is less than the line width W2 of the turning part 106a2. As aforementioned, the special shapes of the redistributing metal line 106a provides larger process margin of the deposition and litho-etching processes for patterning the redistributing metal layer 106. The redistributing metal line 106a of the redistributing metal layer 106 could be consistent even when process variations happen.

Figure 6:
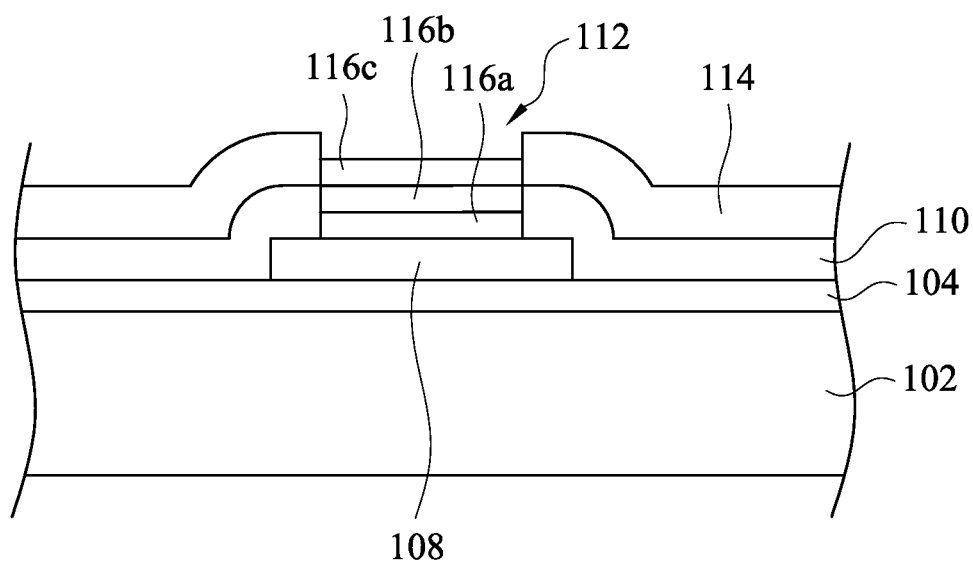
FIG. 6 is a cross-sectional view corresponding to line 3 in FIG. 1 according to another various embodiments of the present disclosure.

FIG. 6 is a cross-sectional view corresponding to line 3 in FIG. 1 according to another various embodiments of the present disclosure. Referring to FIG. 6 and FIG. 1, the chip package 100 according to another various embodiments of the present disclosure further includes a first under bump metallurgy (UBM) 116 disposed in the second opening 112. It should be noticed that the first under bump metallurgy 116 disposed in the second opening 112 could avoid reactions between bonding wires and the bonding pad 108. The first under bump metallurgy 116, for example, could include nickel, which has low consumption rate, as a proper barrier layer. The barrier layer could reduce diffusion between the bonding wires and the bonding pad 108, and therefore an intermetallic compound, which has weak mechanical strength, would not be formed between the bonding wires and the bonding pad 108. Therefore, the issue of fracture between the bonding wires and the bonding pad 108 could be further improved. However, since nickel has a higher oxidation potential, gold could be further formed on the nickel to avoid oxidation. As illustrated in FIG. 6, in various embodiments of the present disclosure, the first under bump metallurgy 116 includes a nickel layer 116a, a palladium metal layer 116b, and a gold metal layer 116c. The nickel layer 116a is disposed on the bonding pad 108. The palladium metal layer 116b is disposed on the nickel layer 116a. The gold metal layer 116c is disposed on the palladium metal layer 116b. In order to obtain a good ohmic contact between the first under bump metallurgy 116 and the bonding pad 108, a dry clean or a wet clean process could be performed before the operation of depositing the first under bump metallurgy 116 to remove native oxides on the bonding pad 108. The first under bump metallurgy 116, for example, could be formed by evaporation, sputtering, chemical plating, or other suitable metal thin film processes, and litho-etched into desired patterns. However, the present disclosure is not limited thereto. Besides, the shape of the redistributing metal line 106a could be similar to that aforementioned (as illustrated in FIG. 4). In other words, the redistributing metal line 106a includes at least two straight parts 106a1 and at least one turning part 106a2, wherein the two straight parts 106a1 extend along different directions, and the turning part 106a2 connects the two straight parts 106a1, and the line width W1 of the two straight parts 106a1 is less than the line width W2 of the turning part 106a2. As aforementioned, the special shapes of the redistributing metal line 106a provides larger process margin of the deposition and litho-etching processes for patterning the redistributing metal layer 106. The redistributing metal line 106a of the redistributing metal layer 106 could be consistent even when process variations happen.

Figure 7:
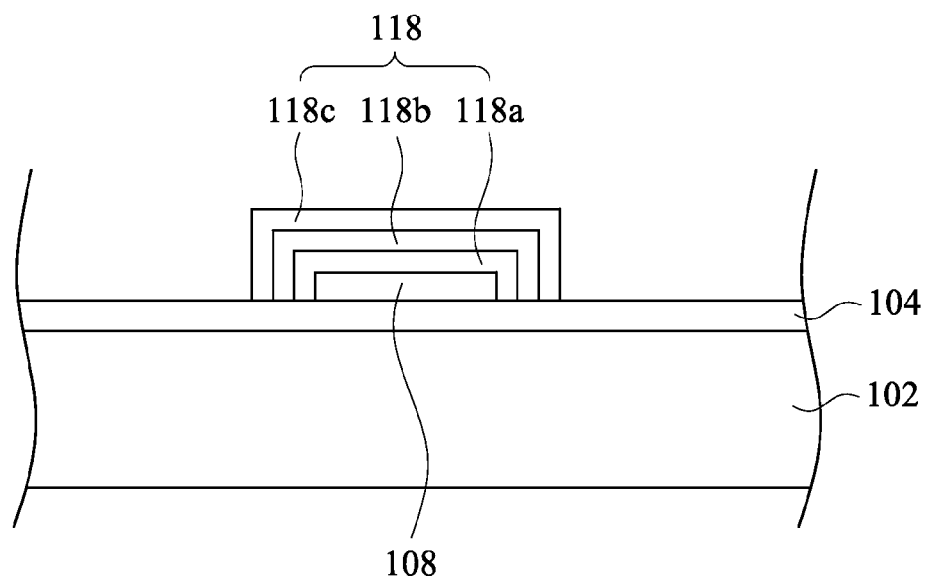
FIG. 7 is a cross-sectional view corresponding to line 3 in FIG. 1 according to another various embodiments of the present disclosure.

FIG. 7 is a cross-sectional view corresponding to line 3 in FIG. 1 according to another various embodiments of the present disclosure. Referring to FIG. 7 and FIG. 1, the chip package 100 according to another various embodiments of the present disclosure further includes a second under bump metallurgy 118 fully covering the bonding pad 108. The difference between the second under bump metallurgy 118 and aforementioned first under bump metallurgy 116 is that the second under bump metallurgy 118 fully covers the bonding pad 108, and aforementioned first under bump metallurgy 116 is disposed in the second opening 112. Therefore, the area of the second under bump metallurgy 118 is greater than that of the bonding pad 108 while the area of the first under bump metallurgy 116 is less than that of the bonding pad 108. The second under bump metallurgy 118 also could avoid reactions between bonding wires and the bonding pad 108. The first under bump metallurgy 116, for example, could include nickel, which has low consumption rate, as a proper barrier layer. The barrier layer could reduce diffusion between the bonding wires and the bonding pad 108, and therefore an intermetallic compound, which has weak mechanical strength, would not be formed between the bonding wires and the bonding pad 108. Therefore, the issue of fracture between the bonding wires and the bonding pad 108 could be further improved. However, since nickel has a higher oxidation potential, gold could be further formed on the nickel to avoid oxidation. As illustrated in FIG. 6, in various embodiments of the present disclosure, the first under bump metallurgy 116 includes a nickel layer 116a, a palladium metal layer 116b, and a gold metal layer 116c. The nickel layer 116a is disposed on the bonding pad 108. The palladium metal layer 116b is disposed on the nickel layer 116a. The gold metal layer 116c is disposed on the palladium metal layer 116b. In order to obtain a good ohmic contact between the first under bump metallurgy 116 and the bonding pad 108, a dry clean or a wet clean process could be performed before the operation of depositing the first under bump metallurgy 116 to remove native oxides on the bonding pad 108. The first under bump metallurgy 116, for example, could be formed by evaporation, sputtering, chemical plating, or other suitable metal thin film processes, and litho-etched into desired patterns. However, the present disclosure is not limited thereto. Besides, the shape of the redistributing metal line 106a could be similar to that aforementioned (as illustrated in FIG. 4). In other words, the redistributing metal line 106a includes at least two straight parts 106a1 and at least one turning part 106a2, wherein the two straight parts 106a1 extend along different directions, and the turning part 106a2 connects the two straight parts 106a1, and the line width W1 of the two straight parts 106a1 is less than the line width W2 of the turning part 106a2. As aforementioned, the special shapes of the redistributing metal line 106a provides larger process margin of the deposition and litho-etching processes for patterning the redistributing metal layer 106. The redistributing metal line 106a of the redistributing metal layer 106 could be consistent even when process variations happen.

Figure 8:
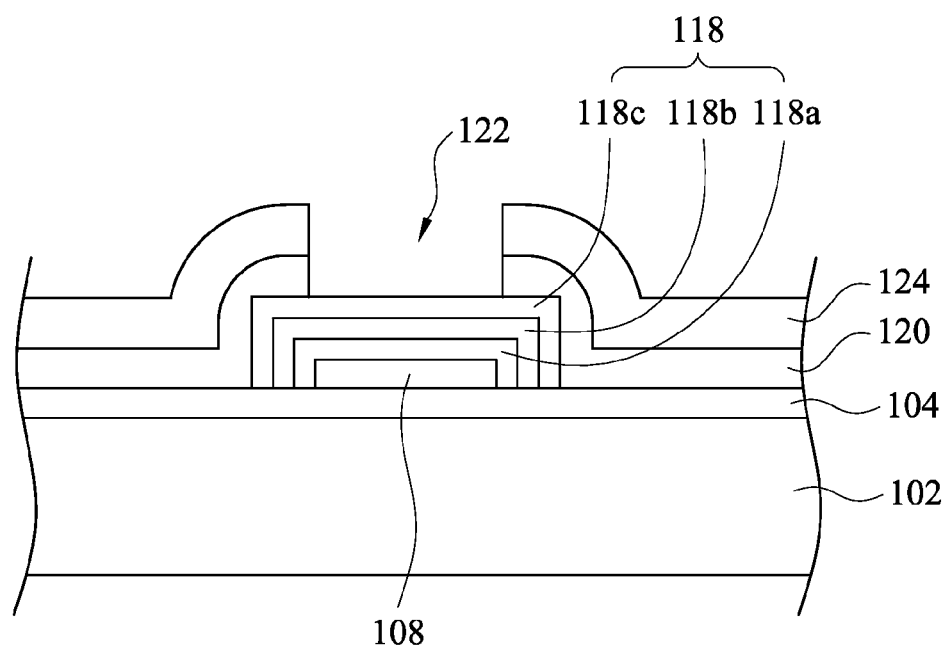
FIG. 8 is a cross-sectional view corresponding to line 3 in FIG. 1 according to another various embodiments of the present disclosure.

FIG. 8 is a cross-sectional view corresponding to line 3 in FIG. 1 according to another various embodiments of the present disclosure. Referring to FIG. 8 and FIG. 1, the difference between the chip package illustrated in FIG. 7 is that the chip package according to another various embodiments of the present disclosure further includes a third passivation layer 120 covering the isolation layer 104 and the second under bump metallurgy 118. The third passivation layer 120 has at least one third opening 122 to expose a part of the second under bump metallurgy 118. The third passivation layer 120 could be also formed by depositing (in chemical vapor deposition (CVD), or spin coating) a third passivation film including silicon oxide, silicon nitride, silicon oxynitride, or other suitable isolation materials covering the isolation layer 104 and the second under bump metallurgy 118. The third passivation film are litho-etched to form the third opening 122 to expose a part of the second under bump metallurgy 118, and the part of the second under bump metallurgy 118 is the site for the bonding wire to bond thereon. It should be noticed that the third passivation layer 120 according to other various embodiments of the present disclosure covers the bonding pad 108 on the surface of the semiconductor chip 102 (including the part of the second under bump metallurgy 118 on the bonding pad 108 and the part of the second under bump metallurgy 118 on the redistributing metal line 106a). Therefore, moistures and pollutants are further isolated from the bonding pad 108 and the redistributing metal line 106a, and the risk of oxidation or deterioration of the bonding pad 108 and the redistributing metal line 106a could be further reduced. In addition, the third passivation layer 120 also further improves the stability of the bonding pad 108 and the second under bump metallurgy 118 during the wire-bonding processes. The chip package 100 according to other various embodiments of the present disclosure has more hardly oxidized and more stable bonding pads 108 to provide better sites for bonding wires to bond thereon. Therefore, the chip package 100 according to other various embodiments of the present disclosure illustrated in FIG. 8 could have much longer lifetime and better reliability than those illustrated in FIG. 7. Besides, the shape of the redistributing metal line 106a could be similar to that aforementioned (as illustrated in FIG. 4). In other words, the redistributing metal line 106a includes at least two straight parts 106a1 and at least one turning part 106a2, wherein the two straight parts 106a1 extend along different directions, and the turning part 106a2 connects the two straight parts 106a1, and the line width W1 of the two straight parts 106a1 is less than the line width W2 of the turning part 106a2. As aforementioned, the special shapes of the redistributing metal line 106a provides larger process margin of the deposition and litho-etching processes for patterning the redistributing metal layer 106. The redistributing metal line 106a of the redistributing metal layer 106 could be consistent even when process variations happen.

Referring to FIG. 8, the chip package according to another various embodiments of the present disclosure further includes a fourth passivation layer 124 disposed on the third passivation layer 120. The fourth passivation layer 124 also has the third opening 122 to expose the part of the second under bump metallurgy 118. The fourth passivation layer 124 could be also formed by depositing (in chemical vapor deposition (CVD), or spin coating) a fourth passivation film including silicon oxide, silicon nitride, silicon oxynitride, or other suitable isolation materials on the third passivation layer 120. Both of the third passivation film and the fourth passivation film are litho-etched to form the third opening 122 to expose the part of the second under bump metallurgy 118, and the part of the second under bump metallurgy 118 is the site for the bonding wire to bond thereon. Therefore, the risk of oxidation or deterioration of the bonding pad 108 could be further reduced. In addition, the second passivation layer 114 and the first passivation layer 110 also further improve the stability of the bonding pad 108 during the wire-bonding processes. The chip package 100 according to other various embodiments of the present disclosure has more hardly oxidized and more stable bonding pads 108 to provide better sites for bonding wires to bond thereon. Therefore, the chip package 100 according to other various embodiments of the present disclosure could have much longer lifetime and better reliability. Besides, the shape of the redistributing metal line 106a could be similar to that aforementioned (as illustrated in FIG. 4). In other words, the redistributing metal line 106a includes at least two straight parts 106a1 and at least one turning part 106a2, wherein the two straight parts 106a1 extend along different directions, and the turning part 106a2 connects the two straight parts 106a1, and the line width W1 of the two straight parts 106a1 is less than the line width W2 of the turning part 106a2. As aforementioned, the special shapes of the redistributing metal line 106a provides larger process margin of the deposition and litho-etching processes for patterning the redistributing metal layer 106. The redistributing metal line 106a of the redistributing metal layer 106 could be consistent even when process variations happen.

It should be noticed that the chip package according to various embodiments of the present disclosure has a special design, and the bonding pads of the chip package only disposed at single side of the chip package. Therefore, bonding process for forming connections between the bonding pads and the bonding wires is simplified and efficient. In addition, the chip package also has special structure of the bonding pads to reduce risks of oxidation or deterioration to connections between the bonding pads and the bonding wires. Therefore, lifetime of the chip package is extended and reliability of the chip package is further improved.

Although the present invention has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims.

What is claimed is:

1. A chip package, comprising:
    a semiconductor chip having at least one conducting pad, an interconnect structure, and a device, a surface of the semiconductor chip extending from a first level to a second level, and the second level being lower than and substantially parallel to the first level, wherein the conducting pad is disposed on the first level of the surface of the semiconductor chip, the interconnect structure and the device are disposed in the semiconductor chip, and the device is electrically connected to the conducting pad through the interconnect structure;
    an isolation layer disposed on the surface of the semiconductor chip, and having at least one first opening to expose a part of the conducting pad;
    a redistributing metal layer disposed on the isolation layer, and having a redistributing metal line corresponding to the conducting pad, wherein the redistributing metal line is connected to the conducting pad through the first opening; and
    at least one bonding pad disposed on the isolation layer and positioned on the second level of the surface of the semiconductor chip,
    wherein the redistributing metal line extends to the bonding pad to electrically connect the conducting pad disposed on the first level of the surface of the semiconductor chip and the bonding pad positioned on the second level of the surface of the semiconductor chip.

2. The chip package of claim 1, further comprising a first passivation layer covering the isolation layer, the redistributing metal layer and the bonding pad, wherein the first passivation layer has at least one second opening to expose a part of the bonding pad.

3. The chip package of claim 2, wherein the first passivation layer includes silicon oxide.

4. The chip package of claim 2, wherein the redistributing metal line comprises at least two straight parts and at least one connecting part, wherein the two straight parts respectively extend along different directions, and the connecting part connects the two straight parts, and a line width of the two straight parts is less than a line width of the connecting part.

5. The chip package of claim 4, wherein the line width of the two straight parts is substantially 30-35 μm, and the line width of the connecting part is substantially 80-85 μm.

6. The chip package of claim 2, further comprising a second passivation layer disposed on the first passivation layer, wherein the second passivation layer also has the second opening to expose the part of the bonding pad.

7. The chip package of claim 6, wherein the first passivation layer comprises silicon oxide, and the second passivation layer comprises silicon nitride.

8. The chip package of claim 6, wherein the redistributing metal line comprises at least two straight parts and at least one connecting part, wherein the two straight parts extend along different directions, and the connecting part connects the two straight parts, and a line width of the two straight parts is less than a line width of the connecting part.

9. The chip package of claim 8, wherein the line width of the two straight parts is substantially 30-35 μm, and the line width of the connecting part is substantially 80-85 μm.

10. The chip package of claim 7, further comprising a first under bump metallurgy disposed in the second opening.

11. The chip package of claim 10, wherein the first under bump metallurgy comprises:
    a nickel layer disposed on the bonding pad;
    a palladium metal layer disposed on the nickel layer; and
    a gold metal layer disposed on the palladium metal layer.

12. The chip package of claim 11, wherein the redistributing metal line comprises at least two straight parts and at least one connecting part, wherein the two straight parts extend along different directions, and the connecting part connects the two straight parts, and a line width of the two straight parts is less than a line width of the connecting part.

13. The chip package of claim 12, wherein the line width of the two straight parts is substantially 30-35 µm, and the line width of the connecting part is substantially 80-85 µm.

14. The chip package of claim 1, further comprising a second under bump metallurgy fully covering the bonding pad.

15. The chip package of claim 14, wherein the second under bump metallurgy comprises:
a nickel layer fully covering the bonding pad;
a palladium metal layer fully covering the nickel layer; and
a gold metal layer fully covering the palladium metal layer.

16. The chip package of claim 14, wherein the redistributing metal line comprises at least two straight parts and at least one connecting part, wherein the two straight parts extend along different directions, and the connecting part connects the two straight parts, and a line width of the two straight parts is less than a line width of the connecting part.

17. The chip package of claim 16, wherein the line width of the two straight parts is substantially 30-35 µm, and the line width of the connecting part is substantially 80-85 µm.

18. The chip package of claim 14, wherein the second under bump metallurgy fully covers the redistributing metal line.

19. The chip package of claim 18, wherein the redistributing metal line comprises at least two straight parts and at least one connecting part, wherein the two straight parts extend along different directions, and the connecting part connects the two straight parts, and a line width of the two straight parts is less than a line width of the connecting part.

20. The chip package of claim 19, wherein the line width of the two straight parts is substantially 30-35 µm, and the line width of the connecting part is substantially 80-85 µm.

21. The chip package of claim 18, further comprising a third passivation layer covering the isolation layer and the second under bump metallurgy, wherein the third passivation layer has at least one third opening to expose a part of the second under bump metallurgy.

22. The chip package of claim 21, wherein the redistributing metal line comprises at least two straight parts and at least one connecting part, wherein the two straight parts extend along different directions, and the connecting part connects the two straight parts, and a line width of the two straight parts is less than a line width of the connecting part.

23. The chip package of claim 22, wherein the line width of the two straight parts is substantially 30-35 µm, and the line width of the connecting part is substantially 80-85 µm.

24. The chip package of claim 19, further comprising a fourth passivation layer disposed on the third passivation layer, wherein the fourth passivation layer also has the third opening to expose the part of the second under bump metallurgy.

25. The chip package of claim 24, wherein the redistributing metal line comprises at least two straight parts and at least one connecting part, wherein the two straight parts extend along different directions, and the connecting part connects the two straight parts, and a line width of the two straight parts is less than a line width of the turning connecting part.

26. The chip package of claim 25, wherein the line width of the two straight parts is substantially 30-35 µm, and the line width of the connecting part is substantially 80-85 µm.

27. The chip package of claim 1, wherein the bonding pad and the redistribution metal line have an interface therebetween.

28. A chip package, comprising:
a semiconductor chip having at least one conducting pad, an interconnect structure, and a device, wherein the conducting pad is disposed on a surface of the semiconductor chip, the interconnect structure and the device are disposed in the semiconductor chip, and the device is electrically connected to the conducting pad through the interconnect structure;
an isolation layer disposed on the surface of the semiconductor chip, and having at least one first opening to expose a part of the conducting pad; and
a redistributing metal layer disposed on the isolation layer, and having a redistributing metal line corresponding to the conducting pad, wherein the redistributing metal line is connected to the conducting pad through the first opening and extended to one side of the semiconductor chip, and the redistributing metal line comprises at least two straight parts and at least one connecting part, wherein the two straight parts extend along different directions, and the connecting part connects the two straight parts, and a line width of the two straight parts is less than a line width of the connecting part.

* * * * *